United States Patent [19]
Childers et al.

[11] Patent Number: 4,965,474
[45] Date of Patent: Oct. 23, 1990

[54] GLITCH SUPPRESSION CIRCUIT

[75] Inventors: Jimmie D. Childers, Missouri City; Roger D. Norwood, Sugarland, both of Tex.

[73] Assignee: Texas Instruments Incorporated, Dallas, Tex.

[21] Appl. No.: 486,621

[22] Filed: Feb. 26, 1990

Related U.S. Application Data

[63] Continuation of Ser. No. 245,197, Sep. 16, 1988, abandoned.

[51] Int. Cl.$^5$ .................. H03K 17/04; H03K 17/687; H03K 19/096; H03K 5/153
[52] U.S. Cl. .................................. 307/542; 307/465; 307/443; 307/296.1; 358/343; 365/206; 365/189.01
[58] Field of Search ............... 307/465, 466, 467, 468, 307/469, 491, 494, 443, 296.1, 296.6, 542; 364/716, 491; 340/825.02, 825.43; 358/343; 354/171; 365/189.01, 189.05, 206

[56] References Cited

U.S. PATENT DOCUMENTS

| | | | |
|---|---|---|---|
| 4,473,850 | 9/1984 | Foerster et al. | 358/343 X |
| 4,570,091 | 2/1986 | Yasuda et al. | 307/473 X |
| 4,661,928 | 4/1987 | Yasuoka et al. | 365/206 X |

Primary Examiner—Stanley D. Miller
Assistant Examiner—David R. Bertelson
Attorney, Agent, or Firm—Lawrence J. Bassuk; Thomas W. DeMond; Melvin Sharp

[57] ABSTRACT

The described embodiment of the present invention includes a combinatorial circuit, such as a multiplexor. All or a portion of the input signals to the multiplexor are also provided to a transition detector. Upon detecting a transition, the transition detector provides a signal which temporarily suppresses the operation of the combinatorial circuit prior to a portion of the combinatorial circuit which is sensitive to glitches and/or timing errors. The delay allows time for glitches and/or timing errors to dissipate. This provides a cleaner signal for the sensitive portion to avoid the errors that the suppressed glitches and/or timing errors may cause.

10 Claims, 6 Drawing Sheets

PRIOR ART

GLITCH SUPPRESSION CIRCUIT

This is a continuation of application Ser. No. 07/245,197, filed Sept. 16, 1988, now abandoned.

FIELD OF THE INVENTION

The present invention relates to the field of digital circuitry. More specifically, the present invention relates the field of error suppression in digital circuitry.

BACKGROUND OF THE INVENTION

Digital techniques have become the circuit techniques of choice in electronic design. The high noise immunity of digital circuitry provides more reliability than analog circuitry. This stems from the binary nature of digital signals. Minor noise or component variations do not affect the information carried on a digital signal so long as they do not change a binary bit from a logical 1 to a logical 0 or vice versa. This provides a high degree of data integrity in digital circuitry.

On the other hand, problems which do cause the value of a binary bit to change (glitches) can cause errors which propagate throughout the circuit. A change in one bit in a digital number can drastically change the value of that number. Thus, although digital circuitry is more immune to error than analog circuitry, the errors that do occur can have more impact. Therefore it is very important to eliminate of mitigate all potential sources of glitches.

One common source of glitches is timing errors. Timing errors occur when signals arrive at the input terminals of a combinatorial circuit, such as a logic gate, at different times. The combinatorial circuit reflects to the combination of the old signal value of the slow signal with the new signal value of the fast signal. The combinatorial circuit then provides an output signal in response to the old and new signals when it should only provide an output signal in response to the two old signals and then the two new signals.

Most digital signals do not arrive at a combinatorial circuit at exactly the same time, but, in most circumstances this is not a problem. Either the combinatorial circuit does not react quickly enough to produce glitch output signal before the correct new signal is received or appropriate timing design assures that these glitches are lost in the system. However, in some asynchronous designs and capacitive discharge circuits, this type of glitch can cause errors or seriously impair proper operation of the circuit. Therefore it is important to eliminate these glitches in those types of circuits which are sensitive to them.

SUMMARY OF THE INVENTION

The described embodiments of the present invention provide a circuit for removing glitches caused by improper timing between received input signals. The circuit includes a transition detector having as input signals the input signals to the combinatorial circuit which is to be prevented from providing a glitch signal. When the transition detector detects a transition in one of the input signals, it provides a disable signal. The disable signal may be used to either disable the output circuit of the combinatorial circuit or disable the input circuitry of the circuit which receives the output signal of the combinatorial circuit. In one embodiment, the transition detector includes a delay generator for internally determining when to discontinue the disable signal. The delay provided by the delay generator is selected to ensure that the output signal of the combinatorial circuit is suppressed longer than the maximum anticipated timing error between the input signals to the combinatorial circuit. Because the output signal of the combinatorial circuit is suppressed until the proper input signals are provided to the combinatorial circuit, erroneous output signals caused by delay between input signals are suppressed.

In brief the invention includes a combinatorial circuit for performing a combinatorial operation in response to at least two input signals, comprising: a combinatorial circuit for receiving said input signals and for receiving a disable signal, said combinatorial circuit providing an output signal in response to said input signals, said combinatorial circuit suppressing said output signal in response to said disable signal; and a transition detector for receiving a portion or all of said input signals, said transition detector providing said disable signal in response to a transistor detected on one of said received input signals.

BRIEF DESCRIPTION OF THE DRAWINGS

The present invention is best understood through the following Detailed Description of the preferred embodiments in conjunction with the Drawings, wherein.

DETAILED DESCRIPTION OF THE PREFERRED EMBODIMENTS

An area where timing errors are a particular problem is in random access memories (RAMs). Timing errors are more prevalent in RAMs because of the long lead lengths which are required. This detailed description deals with an embodiment of the invention designed to prevent errors caused by line delay in providing address signals to the multiplexor which determines the column from which the output bit is selected. This type of error is very problematic in static column mode RAMs. In static column mode, column addresses are fed directly to the column multiplexor for the address input pins. Because the internal circuitry does not have control over the timing of signals coming from off the chip, extreme timing errors must be provided for in the RAM design. Although this specific embodiment is herein described, it is not to be construed as limiting the scope of the invention. Timing errors can occur with any combinatorial digital circuit such as logic gates or gate arrays, for example. In addition, although the discussion in this specification is directed toward digital circuitry, timing errors and other glitches can occur in analog circuitry as well. The invention is equally effective in preventing timing errors in these circuits as it is in the described embodiment.

Figure 1:
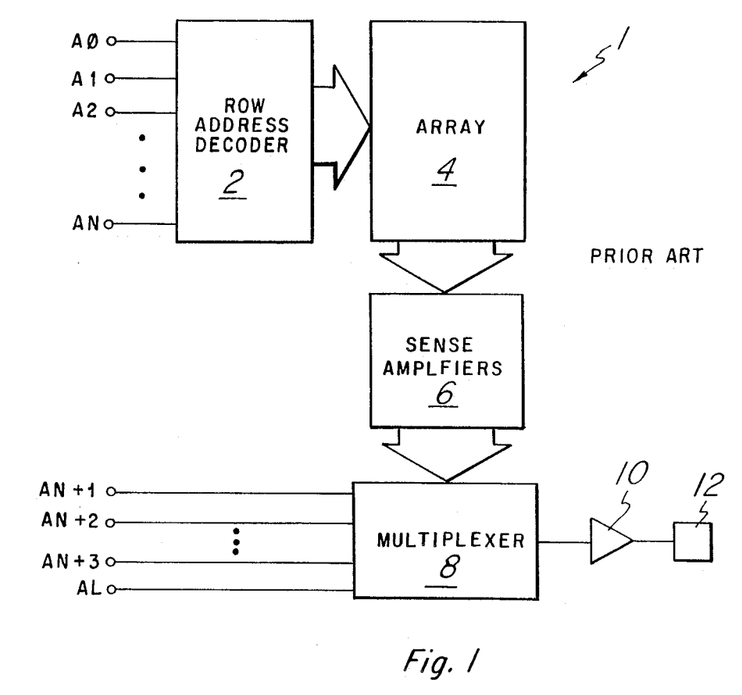
FIG. 1 is a schematic diagram of a prior art memory system.
Figure 2A:
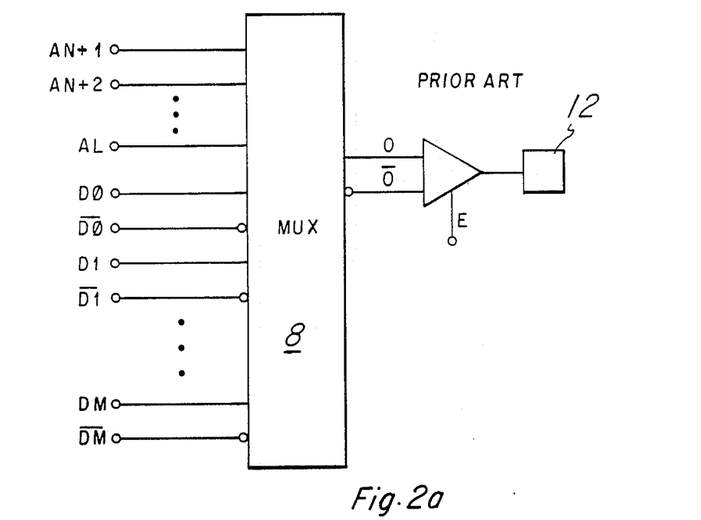
FIG. 2A is a schematic diagram of the column multiplexor and output buffer of FIG. 1.
Figure 2B:
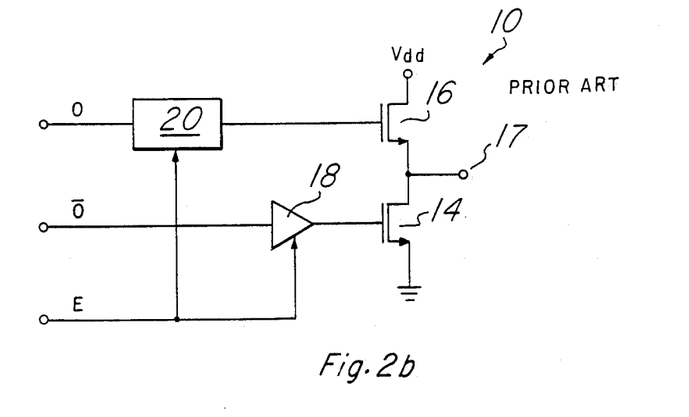
FIG. 2B is a schematic diagram of output buffer 10 of FIG. 2A.
Figure 2C:
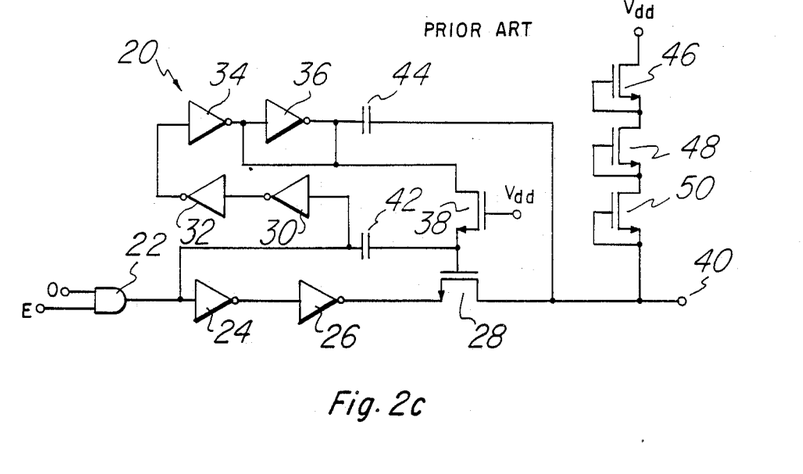
FIG. 2C is a schematic diagram of boosting circuit 20 of FIG. 2B.
Figure 3:
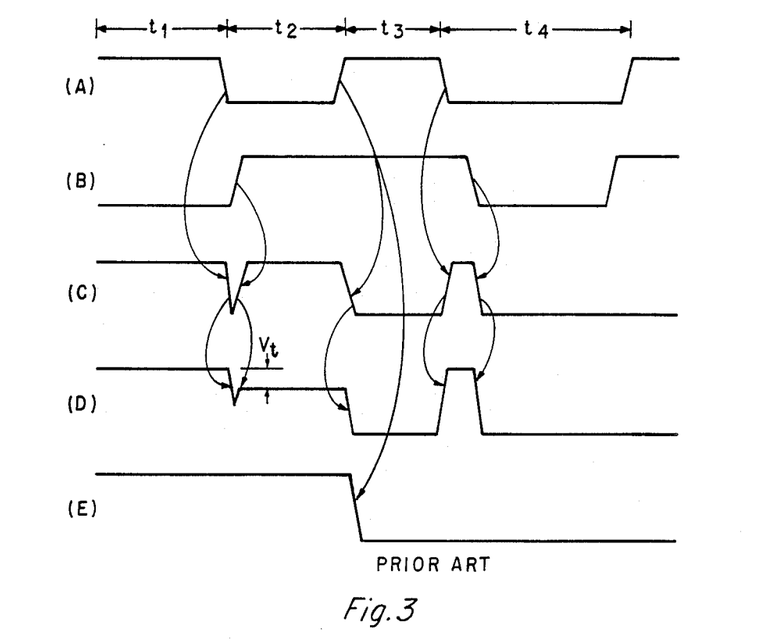
FIGS. 3A through 3E are timing diagrams of the operation of the circuit of FIG. 2A.
Figure 4A:
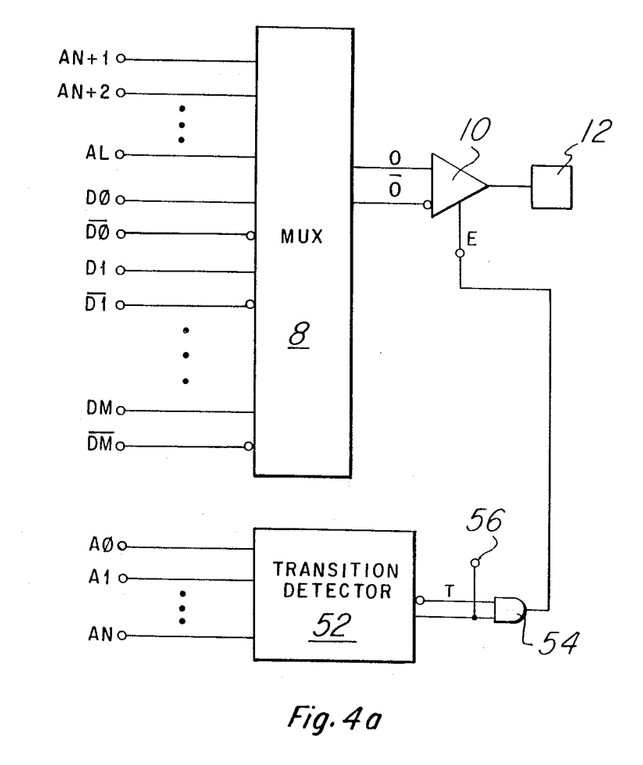
FIG. 4A is a schematic diagram of one embodiment of the present invention.
Figure 4B:
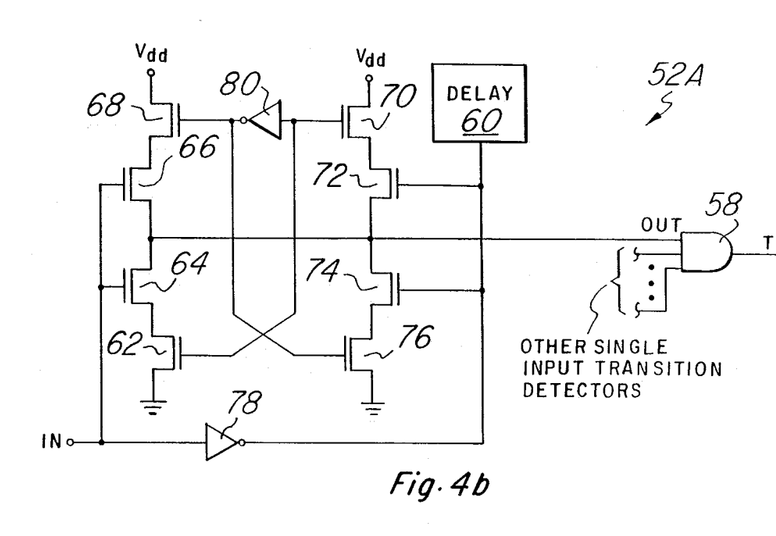
FIG. 4B is a schematic diagram of transition detector 52 of FIG. 4A.

FIG. 1 is a schematic diagram of a simplified prior art random access memory array. FIGS. 2A through 2C are schematic diagrams of the decoding multiplexor. FIGS. 3A through 3E constitute a timing diagram illustrating the problems created by timing errors in the prior art circuits of FIGS. 2A through 2C. FIGS. 4A and 4B are schematic diagrams illustrating one embodiment of the present invention which solves the problems illustrated in FIGS. 1 through 3. FIGS. 5A through 5E constitute a timing diagram illustrating the operation of the embodiment of FIG. 4A and 4B.

FIG. 1 is a schematic diagram of a prior art RAM 1. RAM 1 receives address input signals via address terminals A0 through AL. The signals provided on address terminals A0 through AN drive row address decoder 2. In response to the signals on address terminals A0 through AN, row decoder provides signals to array 4 which selects a row of memory cells in array 4. The signals in the selected memory cells are provided to sense amplifiers 6 which receive the small signals provided from the memory cells, amplify them to full logic levels (usually 0 Volts for a logical 0 and 5 Volts for a logical 1) and 'latch' or store the signals. The latched row of signals is provided to multiplexor 8. Multiplexor 8 selects one of the bits in the stored row of data in response to the address signals provided via address terminals AN+1 through AL. The selected bit is provided to output buffer 10 which provides the selected bit on output terminal 12.

In the current generation of one megabit dynamic RAMs there are 32 signals provided on address terminals AN+1 through AL selecting one of 1,024 bits of data. Because of lead layout requirements, it is almost impossible to provide equal length leads providing the address signals provided on address terminals AN+1 through AL. Thus the address signals often reach multiplexor 8 at different times, possible generating timing errors.

FIGS. 2A through 2C are schematic diagrams detailing the column select circuitry of RAM 1 of FIG. 1. The data bits are provided to multiplexor 8 in complementary form via terminals D0 through DM and $\overline{D0}$ through $\overline{DM}$. Multiplexor 8 selects one data bit and provides the selected date bit in complementary form on leads O and $\overline{O}$. Multiplexor 8 selects the provided data bit in response to address signals provided on address terminals AN+1 through AL. The output data bit is provided to output buffer 10 which in turn provides the data bit to output pad 12. Output buffer 10 is enabled by a signal provided on input terminal E.

FIG. 2B is a schematic diagram of output buffer 10 of FIGS. 1 and 2A. N-channel field effect transistors 14 and 16 drive output terminal 17. The gate of transistor 14 is driven by the signal provided on terminal $\overline{O}$ through buffer 18. For example, if a logical 0 is provided on terminal O, a complementary 1 is provided on terminal $\overline{O}$, through buffer 18 to the gate of transistor 14. Thus transistor 14 conducts and pulls down output terminal 17 to provide a logical 0 on terminal 17. When a logical 1 is provided on terminal O, a logical 0 is provided to the gate of transistor 14 through buffer 18 and thus transistor 14 does not pull down terminal 17. When a signal indicating that buffer 10 should be disabled is received on terminal E, buffer 18 provides a logical 0 signal to the gate of transistor 14 and transistor 14 does not pull down the signal on terminal 17 regardless of the signal on terminal O.

Transistor 16 is driven by booster circuit 20. N-channel transistor 16 is used instead of a P-channel transistor to avoid latch-up problems. However, when a voltage equal to a logical 1, which is approximately equal to $V_{dd}$, is provided to the gate of transistor 16, the voltage provided on terminal 17 is one threshold voltage ($V_{th}$) less than $V_{dd}$. This voltage drop is unacceptable in many applications. To eliminate this problem, boosting circuit 20 provides a signal to the gate of transistor 16 which is more than one $V_{th}$ greater than $V_{dd}$ (boosted signal). When the signal on terminal O is a logical 1, boosting circuit 20 provides a boosted signal and transistor 16 pulls up the signal on terminal 17 to $V_{dd}$. When the signal on terminal O is a logical 0, boosting circuit 20 provides a logical 0 and transistor 16 does not pull up the signal on terminal 17. When a signal indicating that buffer 10 should be disabled is received on terminal E, boosting circuit 20 provides a logical 0 output signal and transistor 16 does not pull up the signal on terminal 17 regardless of the signal on terminal O.

FIG. 2C is a schematic diagram of boosting circuit 20 of FIG. 2B. Many types of boosting circuits are used in the art. FIG. 2C illustrates one example of a boosting circuit. When a logical 0 is provided on either terminal O or terminal E, AND gate 22 provides an output signal of 0. The output signal of AND gate 22 is inverted once by invertor 24 and inverted back by invertor 26. Thus the signal on the drain of transistor 28 is 0 volts. The output signal of AND gate 22 is also inverted once by invertor 30, inverted back by invertor 32 and inverted again by invertor 34. Thus invertor 34 provides a logical 1 or a signal of $V_{dd}$. Because the gate of transistor 38 is tied to $V_{dd}$, the drain of transistor 38, and thus the gate of transistor 28, is pulled to $V_{dd}$ less $V_{th}$. This voltage causes transistor 28 to be on which pulls terminal 40 to 0 Volts. Thus the voltage provided by boosting circuit 20 is low and transistor 16 (FIG. 2B) does not conduct.

Boosting circuit 20 develops the charge to provide a boosted voltage signal during the transition from a low voltage output signal to a high voltage boosted output signal. When a logical 1 signal is provided on terminal E and the signal on terminal O changes from a logical 0 to a logical 1, the positive charge accumulated on the plate of capacitor 42 connected to the gate of transistor 28 boosts the voltage on the gate of transistor 28 to greater than $V_{dd}$. The positive charge was accumulated while the plate of capacitor 42 connected to the output terminal of AND gate 22 was held a 1 volts and the plate of capacitor 42 connected to the gate of transistor 28 was held at $V_{dd}$ less $V_{th}$. Capacitor 42 must be a relatively small capacitance device to avoid over charging of the gate of transistor 28 and thereby destroying the gate insulator of transistor 28. The internal delays of invertors 24 and 26 allow time for capacitor 42 to dump charge onto the gate of transistor 28. By the time the output signal of invertor 26 goes from logical 0 to logical 1, the gate of transistor 28 is boosted to at least $V_{dd}$ plus $V_{th}$. Therefore a full $V_{dd}$ is provided to terminal 40 through transistor 28.

The $V_{dd}$ voltage level to terminal 40 also charges the plate of capacitor 44 connected to terminal 40 with a positive charge. The plate of capacitor 40 connected to the output terminal of invertor 36 is, at this time, held to 0 Volts. While capacitor 44 is charging, the logical 1 on the input terminal of invertor 30 propagates through invertors 30, 32 and 34 to provide a logical 0 to the source of transistor 38. This logical 0 voltage level causes the gate of transistor 28 to be pulled low through transistor 38. Thus transistor 28 ceases to conduct. As this occurs, the signal on the output terminal of invertor 36 goes from a logical 0 level to a logical 1 or $V_{dd}$ level. This causes the positive charge on the plate of capacitor 44 which is connected to terminal 40 to dump charge on to terminal 40. Capacitor 44 is selected to have a very large capacitance relative to the gate capacitance of transistor 16 (FIG. 2B) and the charge cannot be discharged through transistor 28, which is not conducting, so the voltage level on the gate of transistor 16 (FIG. 2B) is boosted well above $V_{dd}$. Transistors 46, 48 and 50 are all gate strapped to the drain, which is connected away from $V_{dd}$, and connected in series. Therefore, these transistors will begin to conduct if the voltage on terminal 40 rises to greater than 3 times $V_{th}$ above $V_{dd}$. This limits the voltage on terminal 40 thereby avoiding damage to transistor 16 (FIG. 2B).

The circuits of FIG. 1 and FIGS. 2A through 2C are herein provided in detail to allow for a precise explanation of the problem solved by the present invention. FIGS. 3A through 3E are timing diagrams illustrating the problems caused by timing errors in the circuit of FIG. 1 and FIGS. 2A through 2C. The timing diagrams of FIGS. 3A through 3E show the operation of a greatly simplified version of this circuit. In this example N is equal to 0 and L is equal to 2. Therefore the array 4 (FIG. 1) includes 1 row and no row address signals are required. FIG. 3A represents the address signal on address terminal A1 and FIG. 3B represents the address signal on terminal A2. Because two binary bits can address four addresses, the row of storage elements includes 4 memory cells. The data stored in these memory cells in this example, with the corresponding addresses, are laid out in the table below.

| A1 | A2 | D |
|----|----|----|
| 0  | 0  | 0 |
| 0  | 1  | 1 |
| 1  | 0  | 1 |
| 1  | 1  | 0 |

FIG. 3C shows the signal provided on terminal O (FIG. 2A) by multiplexor 8 in response to the signals shown in FIGS. 3A and 3B and the stored data shown in the table above. During time period $t_1$, multiplexor 8 provides a logical 1 signal corresponding to the data stored in the 1-0 position (A1=1 and A2=0). During time period $t_2$, the address signals provided indicate that the data stored at position 0-1 is to be provided and thus a logical 1 is placed on terminal O. However, due to timing errors multiplexor 8 temporarily provides the data stored at position 0-0. This shows up as a downward spike in the signal provided on terminal O.

In most circumstances, the spike on terminal O is ignored by subsequent circuitry because the circuitry is designed to ignore such spikes. However, the circuit of FIG. 2C is affected adversely by this type of spike. FIG. 3D is a timing diagram of the signal provided on terminal 17 (FIG. 2B). During time period $t_1$, output buffer 10 provides a full $V_{dd}$ output signal on terminal 17 because boosting circuit 20 boosts the voltage on the gate of transistor 16 (FIG. 2B) well above $V_{dd}$ plus $V_{th}$. When boosting circuit 20 receives the spike, the 'temporary' logical 0 propagates through boosting circuit 20 to provide a logical 0 on the output terminal of inverter 26.

The logical 0 also propagates through to cause a logical 1 on the output terminal of invertor 34. This logical 1 turns on transistor 28 through transistor 38. This begins to pull the voltage level on terminal 40 to 0. When the proper signal is provided to boosting circuit 20. Capacitor 44 is unable to charge sufficiently to provide proper boosting to the gate of transistor 16 (FIG. 2B). Thus an inadequate voltage of $V_{dd}$ less $V_{th}$ is provided on output terminal 17. In some situations this inadequate voltage can cause major data errors and is thus unacceptable.

An upward spike is illustrated by the transition from time period $t_3$ to time period $t_4$. An upward spike does not cause output errors in this particular circuit, but can cause errors in some circuits. FIG. 3E is a timing diagram showing the desired output signal on terminal 17.

In certain applications it is necessary to eliminate spikes generated by timing errors. FIGS. 4A and 4B are schematic diagrams of one embodiment of the present invention designed to alleviate the spikes illustrated above in conjunction with FIGS. 1, 2A through 2C and FIGS. 3A through 3E. The embodiment of FIGS. 4A and 4B illustrate the example of the present invention with regard to column demultiplexion of data stored in a random access memory device. Although this one embodiment is described herein, the specific embodiment is not to be construed in any way as limiting the scope of the invention. The present invention finds broad applicability in any combinatorial logic or other type of circuit accepting two or more input signals and providing an output signal in response thereto.

FIG. 4A is a schematic diagram of one embodiment of the present invention. Multiplexor 10, buffer 10 and output terminal 12 operate in the same manner as similarly numbered components in FIG. 2A. The circuit of FIG. 4A further includes transition detector 52. Enable signals are often provided externally to the chip or generated on chip in response to other signals. In this embodiment, this signal is provided to the circuit of FIG. 4A via terminal 56. The address signals provided on address terminals AN+1 through AL are provided to transition detector 52. Transition detector 52 provides an output signal on terminal T which is a logical 1 when no transition has been detected and a logical 0 when a transition is detected. When a logical 1 is provided by transition detector 52 and a logical 1 enable signal is provided on terminal 56, AND gate 54 provides a logical 1 to output buffer 10 and output buffer 10 provides an output signal to terminal 12 dependent on the signal provided on terminals O and $\overline{O}$. If the enable signal on terminal 56 or the output signal of transition detector 52 is logical 0, output buffer 10 is disabled and provides a high impedance to terminal 12.

A schematic diagram of a portion of transition detector 52 is shown in FIG. 4B. The portion shown in FIG. 4B operates on one input signal provided on terminal IN. If multiple input signals are to be processed by transition detector 52, one of each of the circuits shown in FIG. 4B must be provided and the output signals of the multiple circuits, provided on terminal OUT, must be combined by a AND gate such as AND gate 58. Single input transition detector 52A operates by providing a temporary transition detect signal of logical 0, in response to a detected transition, on terminal OUT of a duration set by delay unit 60.

In discussing the operation of partial transition detector 52A, transistors 62, 64, 66, 68, 70, 72, 74 and 76 are assumed to be pure switching devices. Therefore, when one of these transistors is said to 'on' it means the transistor channel is conducting. Conversely, when a transistor is said to be 'off' it means the transistor channel is not conducting. When a logical 0 signal is provided on terminal IN, P-channel transistor 66 is on and N-channel transistor 64 is off. The signal on IN is inverted by invertor 78 and the output signal of logical 1 causes P-channel transistor 72 to be off and N-channel transistor 74 to be on. Assuming the signal on IN has been a logical 0 longer than the fixed delay of delay circuit 60, a logical 1 signal is provided to the gate of P-channel transistor 70 and the gate of N-channel transistor 62. Thus transistor 70 is off and transistor 62 is on. The logical 1 provided to the input terminal of invertor 80 is inverted to provide a logical 0 on the gates of P-channel transistor 68 and N-channel transistor 76. Thus transistor 68 is on and transistor 76 is off. In this state, the only path from terminal OUT to either $V_{dd}$ or ground is through transistors 66 and 68. Therefore, the signal provided on terminal OUT is $V_{dd}$ or a logical 1.

When the signal on terminal IN changes to a logical 1, P-channel transistor 66 turns off and N-channel transistor 64 turns on. At this time, the change in the signal has not propagated through delay unit 60 so a logical 1 is on the gate of N-channel transistor 62 and transistor 62 is on. Because both transistors 62 and 64 are on and transistor 66 is off, the signal on terminal OUT is pulled to ground of a logical 0. The logical 1 on terminal IN is inverted by invertor 78 to provide a logical 0 on the gates of P-channel transistor 72 and N-channel transistor 74. Thus transistor 72 is turned on and transistor 74 is turned off. Because the new signal has not yet propagated through delay unit 60, the signal on the gate of P-channel transistor 70 is a logical 1 and transistor 70 is off. After the logical 0 has propagated through delay unit 60, the logical 0 on the gates of P-channel transistor 70 and N-channel transistor 62 causes transistor 70 to turn on and transistor 62 to turn off. Therefore, the path from terminal OUT to ground is broken and a path from terminal out through transistors 70 and 72 to $V_{dd}$ is established providing a logical 1 signal on terminal OUT. Thus partial transition detector 52A provides a logical 0 output signal after the transition from logical 0 to logical 1 of the signal on terminal IN for a period determined by the delay built into delay unit 60. The delay of delay unit 60 may be provided by any number of techniques, such as RC timing delays, multiple gate delays or clocked timing, for example. The logical 0 output signal of delay unit 60 is inverted by invertor 80 to provide a logical 1 on the gates of P-channel transistor 68 and N-channel transistor 76. Thus transistor 68 is off and transistor 76 is on.

If the signal on terminal IN now changes from a logical 1 to a logical 0, invertor 78 inverts the signal on terminal IN to provide a logical 1 on the gates of P-channel transistor 72 and N-channel transistor 74. Thus transistor 72 turns off and transistor 74 turns on. Transistor 76 remains on until this logical 1 has propagated through delay unit 60 and invertor 80. Therefore, the path from terminal OUT to $V_{dd}$ is broken at transistor 72 and a path from terminal OUT through transistors 74 and 76 to ground is established. Thus a logical 0 output signal is provided on terminal OUT. The logical 0 on terminal IN causes P-channel transistor 66 to turn on and N-channel transistor 64 to turn off. After the logical 1 signal provided by invertor 78 has propagated through delay unit 60, invertor 80 inverts this signal to provide a logical 0 on the gates of P-channel transistor 68 and N-channel transistor 76. Thus transistor 68 turns on and transistor 76 turns off. Therefore, the path from terminal OUT to ground is broken at transistor 76 and a path from terminal OUT through transistors 66 and 68 is established. Thus a logical 1 is provided on terminal OUT. The logical 1 provided by delay unit 60 causes P-channel transistor 70 to turn off and N-channel transistor 62 to turn on. This brings partial transition detector 52A to the quiescent state with a logical 0 input signal as described above. In summary partial transition detector 52A provides a logical 0 output signal of selected duration upon the transition of the signal provided on terminal IN from either a logical 0 to a logical 1 or from a logical 1 to a logical 0. Otherwise, partial transition detector provides a logical 1 output signal.

The output signals of the partial transition detectors (only partial transition detector 52A is shown) are provided as input signals to AND gate 58. When no transitions are detected by the partial transition detectors, all the input signals to AND gate 58 are logical 1 and the output signal of AND gate 58 is a logical 1. If any of the partial transition detectors detects a transition, one of the input signals to AND gate 58 is a logical 0 and the output signal of AND gate 58 is a logical 0.

Figure 5:
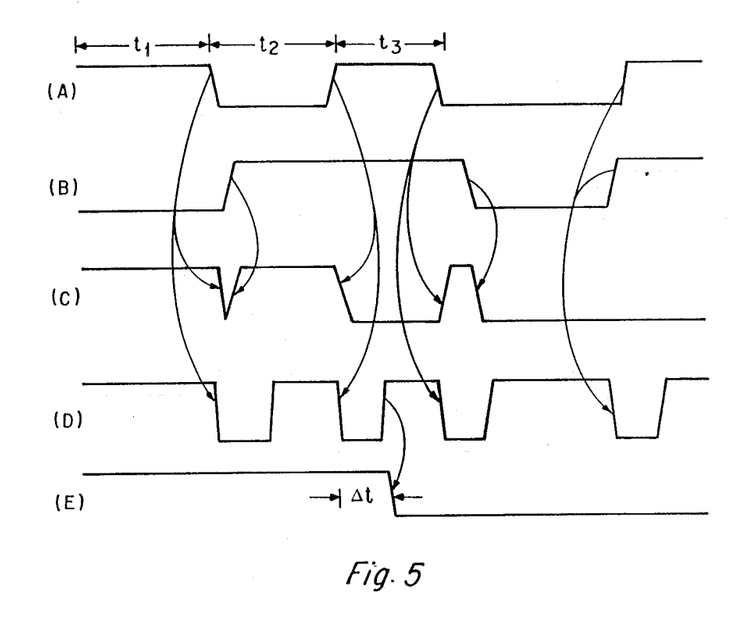
FIGS. 5A through 5E are timing diagrams of the operation of the circuit of FIG. 4A.

The operation of the embodiment of FIGS. 4A and 4B is illustrated in the timing diagrams of FIGS. 5A through 5E. FIGS. 5A through 5C are the same a FIGS. 3A through 3C and describe the same signals. The signals shown in FIGS. 5A and 5B are provided to transition detector 52 and the output of transition detector 52 is shown in FIG. 5D. When a transition is detected, transition detector 52 provides a logical 0 signal to AND gate 54 which then provides a logical 0 to enable terminal E of buffer 10. The logical 0 enable signal causes boosting circuit 20 (FIG. 2C) to provide a logical 0 on terminal 40 (FIG. 2C). This causes capacitor 44 (FIG. 2C) to discharge. However, the delay provided by transition detector 52 is selected to be long enough to allow capacitor 44 to charge and thus allow boosting circuit 20 to operate normally. Thus when spikes occur at the transitions from time periods $t_1$ to $t_2$ and $t_3$ to $t_4$ as shown in FIG. 5C, output buffer 10 is disabled and the output signal of output buffer 10 is suppressed. Although output buffer 10 is providing a high impedance output signal, the time periods involved are so short that the signal on terminal 12 does not change while the output signal of buffer 12 is suppressed. This is reflected in FIG. 5E. Thus output buffer 10 provides the spikeless output signal shown in FIG. 5E on output terminal 12. By blocking the downward spike, the present embodiment allows boosting circuit 20 to properly charge, thus providing a full $V_{dd}$ output signal during time period $t_2$ unlike the prior art signal shown in FIG. 3D. As alternative embodiments, the disable signal may be provided directly to the combinatorial circuit o or to circuitry interposed between multiplexor 8 and output buffer 10. Any of these embodiments are design choices which are clearly within the scope of the present invention.

Although specific embodiments are herein described, it is not to be construed as limiting the scope of the invention.

The scope of the invention is only limited by the claims appended hereto in which we claim:

1. A circuit for preventing timing glitches in the output of a memory device of the type having a plurality of addressable storage cells comprising:

decode circuitry coupled to receive digital address information for outputting a first signal from one of the storage cells;

an output buffer, including terminals for connection to a supply voltage and a reference voltage, coupled to the decode circuitry to provide a second signal indicative of the first signal at an output terminal, said buffer including:

an N-channel pull-up transistor connected for conduction between the supply voltage terminal and said output terminal to render the output signal logic-high when the first signal is indicative of a logic-high stage; and an N-channel pull-down transistor connected for conduction between said output terminal and the reference terminal to render the output signal logic-low when the first signal is indicative of a logic-low state;

booster circuitry connected between the decode circuitry and an input to the pull-up transistor, said booster circuitry including a charging capacitor for providing sufficient voltage to the pull-up transistor to render the output signal logic-high when the first signal changes from a logic-low state to a logic-high state;

detection circuitry providing a transition signal indicative of a change in a portion of the address information; and logic circuitry responsive to the transition signal for discharging the capacitor each time said portion of address information transitions to a different digital state.

2. The circuit of claim 1 wherein:

said booster circuitry provides a logic-low input voltage to the pull-up transistor in response to a first enable signal; and said logic circuitry includes an AND gate having a first input terminal for receiving said transition signal and a second input terminal for receiving a second enable signal.

3. The circuit of claim 1 wherein said detection circuitry sustains transition signal output for a sufficient time duration to charge the capacitor and provide sufficient input voltage to the pull-up transistor when the signal provided by the decode circuitry changes from a low voltage to a high voltage.

4. A glitch suppression circuit comprising:

input terminals for receiving changing input signals that select information for output;

output buffer circuits including output transistors connected between power leads and providing said selected information, said output buffer circuits including boost circuits connected to at least one of said output transistors, said boost circuits including charging circuits for accumulating charge for a certain period to boost said at least one output transistor to a desired output voltage; and transition circuits connected to said input terminals and said output buffer circuits for disabling connection of said selected information to said output signals, until said charging circuits accumulate charge for said certain period.

5. The glitch suppression circuit of claim 4 in which said transistors connected between said power leads include N-channel transistors.

6. The glitch suppression circuit of claim 4 in which said charging circuits include a capacitor accumulating charge.

7. The glitch suppression circuit of claim 4 in which said charging circuits accumulate charge for a certain period sufficient to boost said at least one output transistor to conduct at least the voltage of said power leads.

8. The glitch suppression circuit of claim 4 in which said transition circuits include one set of transistors connected to one of said input terminals and said output buffer circuits, another set of transistors connected between said power leads and said one set of transistors and a delay circuit connecting said another set of transistors to said one set of transistors to delay operation of said another set of transistors.

9. The glitch suppression circuit of claim 8 in which said sets of transistors are connected in two circuit loops between said power leads.

10. The glitch suppression circuit of claim 9 in which in each circuit loop two transistors of said one set are connected between two transistors of said another set between said power leads.

* * * * *